US008236606B2

(12) United States Patent
Lee

(10) Patent No.: US 8,236,606 B2
(45) Date of Patent: Aug. 7, 2012

(54) METHOD AND SYSTEM FOR PROVIDING A LOW-PROFILE SEMICONDUCTOR ASSEMBLY

(75) Inventor: Michael G. Lee, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 210 days.

(21) Appl. No.: 12/829,569

(22) Filed: Jul. 2, 2010

(65) Prior Publication Data

US 2010/0267201 A1    Oct. 21, 2010

Related U.S. Application Data

(62) Division of application No. 11/942,782, filed on Nov. 20, 2007, now abandoned.

(51) Int. Cl.
*H01L 21/44* (2006.01)
(52) U.S. Cl. ......... 438/108; 438/118; 438/455; 438/613
(58) Field of Classification Search .................. 257/737, 257/738, 777, 778, 780, E23.021, E23.069, 257/E23.127; 438/107, 108, 118, 119, 455, 438/456, 613
See application file for complete search history.

(56) References Cited

U.S. PATENT DOCUMENTS

| 5,796,591 | A * | 8/1998 | Dalal et al. ................. | 361/779 |
| 7,180,181 | B2 * | 2/2007 | Liu et al. ..................... | 257/724 |
| 2005/0082680 | A1 | 4/2005 | Liu et al. | |
| 2007/0215927 | A1 * | 9/2007 | Kuramochi ................. | 257/301 |
| 2008/0135279 | A1 * | 6/2008 | Ishido ........................ | 174/255 |

FOREIGN PATENT DOCUMENTS

| JP | 6232203 | 8/1994 |
| JP | 10335527 | 12/1998 |
| JP | 10335527 A * | 12/1998 |

OTHER PUBLICATIONS

Optical lithography: Introduction by G.L.-T. Chiu and J.M. Shaw; IBM J. Res. Develop. vol. 41, No. 1/2; 4 pages, Jan./Mar. 1997.
Flip Chips Dot Com; Tutorial 1—Oct. 2000; Introduction to Flip Chip: What, Why, How; George A. Riley, FlipChips.com; http://www.flipchips.com/tutorial01.html; 7 pages, Posted Oct. 2000.
Flip Chips Dot Com; Tutorial 2—Nov. 2000; Solder Bump Flip Chip; http://www.flipchips.com/tutorial02a.html; 10 pages, Nov. 2000.
Japanese Office Action with English translation; Application No. 2008-296094; pp. 4, Nov. 29, 2011.

* cited by examiner

*Primary Examiner* — Matthew E Warren
(74) *Attorney, Agent, or Firm* — Baker Botts L.L.P.

(57) ABSTRACT

A semiconductor assembly is provided that includes a substrate that has a first surface. A chip is coupled to the substrate. The chip has a second surface that faces the first surface of the substrate. The chip is spaced apart from the substrate forming a gap. At least a portion of the substrate is coupled to the chip by solder bumps. The solder bumps include a deformable material, such that as a height of the gap between the chip and the substrate increases, the solder bumps deform into a stretched state. An underfill material is applied between the substrate and the chip. The underfill material substantially fills the gap between the chip and the substrate and surrounds the solder bumps in the stretched state. Barricades comprising non-conductive protrusions are disposed between the first surface of the substrate and the second surface of the chip. The barricades confine the solder bumps in a compressed state.

10 Claims, 5 Drawing Sheets

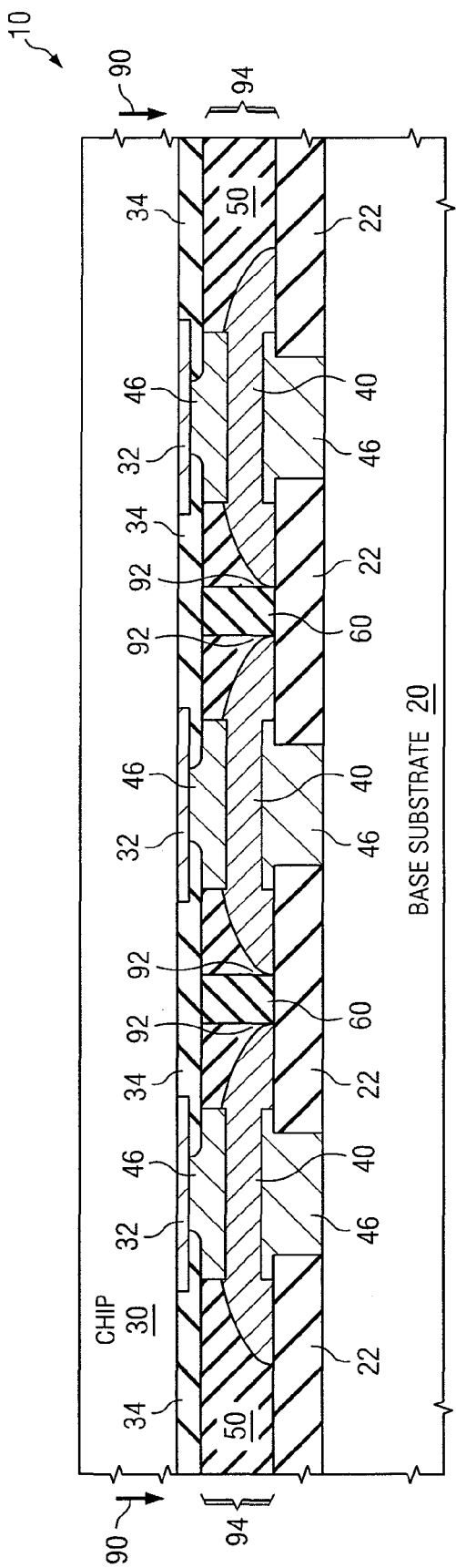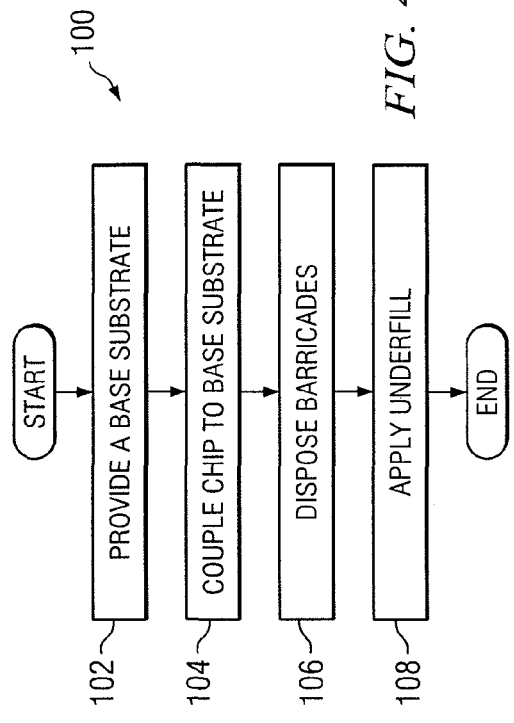

METHOD AND SYSTEM FOR PROVIDING A LOW-PROFILE SEMICONDUCTOR ASSEMBLY

CROSS-REFERENCE TO RELATED APPLICATION

This Application is a divisional application of U.S. application Ser. No. 11/942,782, filed Nov. 20, 2007 and entitled "Method and System for Providing a Low-Profile Semiconductor Assembly."

TECHNICAL FIELD

This invention relates generally to semiconductors and, more particularly, to a method and system for providing a low-profile semiconductor assembly.

BACKGROUND

Low-profile semiconductor assemblies are in high demand. In response to the high demand, semiconductor assemblies have been developed that include chips coupled to substrates using low-profile interconnections. For example, the low-profile interconnections may comprise solder bumps that provide an electric path between the chip and the substrate.

However, the solder bumps may suffer from stress caused by relative movement between the chip and substrate. As a result, the solder bumps and assembly may suffer from reliability problems. For example, the substrate and the chip may have a different coefficient of thermal expansion (CTE). The stress caused by the different CTEs may cause the solder bumps to crack. A material referred to as underfill may be applied between the chip and the substrate to reinforce the mechanical strength of the assembly. As the profile height decreases, however, it becomes more difficult to apply underfill material between the chip and the substrate. Moreover, even if it is possible to apply underfill, some small amounts of underfill material may flow between the solder bumps and the substrate and may cause significant reliability problems.

SUMMARY OF THE DISCLOSURE

The present invention provides a method and system for providing a low-profile semiconductor assembly that substantially eliminates or reduces at least some of the disadvantages and problems associated with previous methods and systems.

According to one embodiment of the present invention, a semiconductor assembly is provided that includes a substrate that has a first surface. A chip is coupled to the substrate. The chip has a second surface that faces the first surface of the substrate. The chip is spaced apart from the substrate forming a gap. At least a portion of the substrate is coupled to the chip by solder bumps. The solder bumps include a deformable material, such that as a height of the gap between the chip and the substrate increases, the solder bumps are operable to deform into a stretched state. An underfill material is applied between the substrate and the chip. The underfill material is operable to substantially fill the gap between the chip and the substrate and surround the solder bumps in the stretched state. Barricades comprising non-conductive protrusions are disposed between the first surface of the substrate and the second surface of the chip. The barricades are operable to confine the solder bumps in a compressed state.

Certain embodiments of the invention may provide one or more technical advantages. A technical advantage of one embodiment may include a semiconductor assembly with deformable solder bumps that deform into a stretched state when the gap height of the assembly is increased. An underfill material may then be applied to reinforce the assembly. The gap height is then decreased and the deformable solder bumps deform into a compressed state to form a lower profile assembly. Thus, a low-profile semiconductor assembly may be manufactured with good reliability and performance.

Another technical advantage of one embodiment may include barricades that confine the deformable solder bumps in the compressed state. Thus, the barricades prevent the deformed solder bumps from contacting each other and the deformed solder bumps prevent underfill from flowing between the solder bumps and the substrate.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 3D is a diagram illustrating the assembly of FIG. 3C with a decreased gap height, in accordance with one embodiment of the present invention; and FIG. 4 is a flow diagram illustrating an example method for providing a semiconductor assembly, in accordance with one embodiment of the present invention.

DETAILED DESCRIPTION OF THE DRAWINGS

Embodiments of the present invention and its advantages are best understood by referring to FIGS. 1-4 of the drawings, like numerals being used for like and corresponding parts of the various drawings.

Figure 1A:
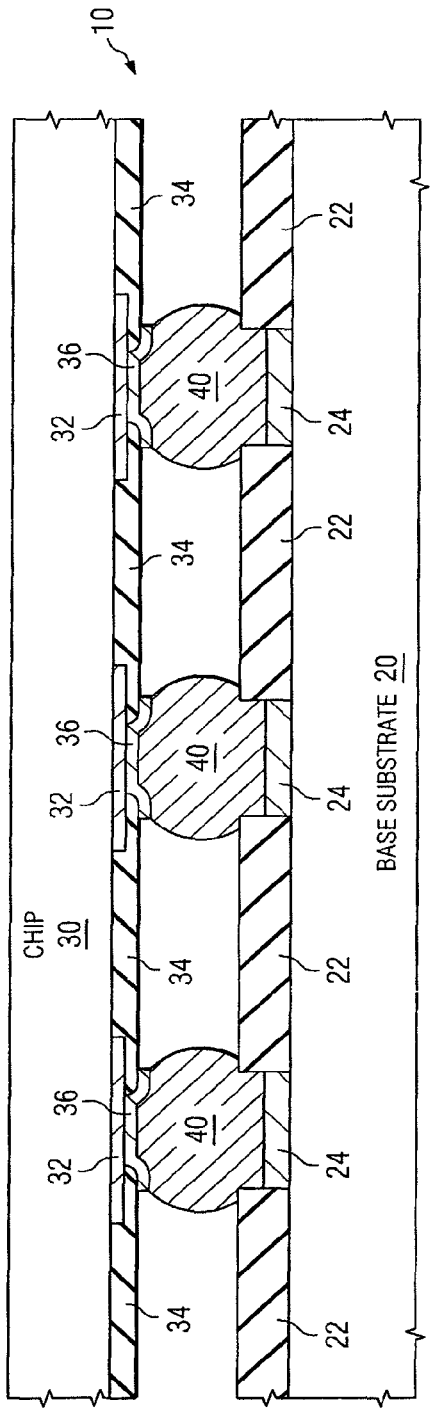
FIG. 1A is a diagram illustrating an example semiconductor assembly.

FIG. 1A is a diagram illustrating an example semiconductor assembly 10. Semiconductor assemblies, such as assembly 10, are devices in which one or more semiconductor chips (e.g., integrated circuits) are coupled to a base substrate. The base substrate may be used to couple a chip to other components on or external to the substrate. Typically, to couple the chip to the substrate, solder bumps are applied to the surface of the chip. The chip and the applied solder bumps are aligned over the base substrate, such that each solder bump at least partially fills a bump pad on the base substrate, and such that the chip is spaced apart from the base substrate by a gap. Underfill material may be applied in the gap between the chip and the base substrate to reinforce the mechanical strength of the assembly. However, if the gap height between the chip and the substrate is small, it is difficult to apply underfill material between the chip and the substrate. Moreover, even if it is possible to apply underfill, some small amounts of underfill material may flow between the solder bumps and the substrate, thereby causing significant reliability problems.

As described in more detail below, deformable solder bumps are able to be temporarily deformed into a stretched state so that the gap height of the assembly can be increased. Underfill material may then be applied to reinforce the assembly. The gap height can then be decreased and the solder bumps deform into a compressed state to form a lower profile assembly. Barricades are disposed on the base substrate and/or the chip that are operable to confine the deformed solder bumps in the compressed state. Thus, the barricades prevent the deformed solder bumps from contacting each other and the deformed solder bumps prevent underfill from flowing between the solder bumps and the base substrate.

Figure 1B:
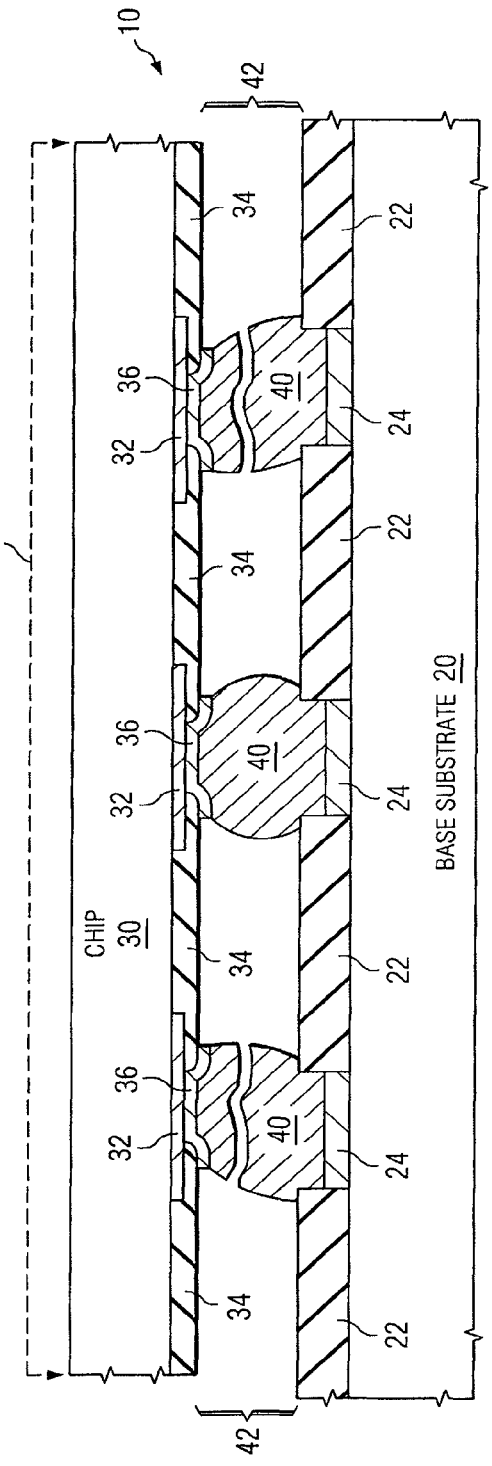
FIG. 1B is a diagram illustrating an example of the results of stress to the assembly of FIG. 1A.
Figure 1C:
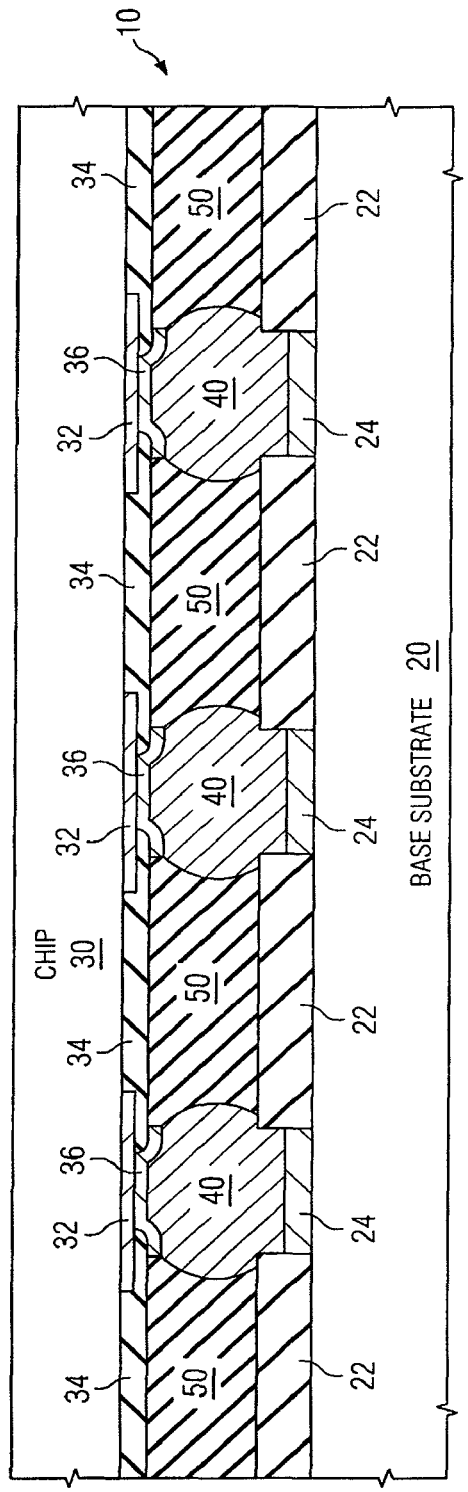
FIG. 1C is a diagram illustrating an underfill material applied to the assembly of FIG. 1A.

As shown in FIG. 1A, assembly 10 includes a base substrate 20 and a chip 30. Base substrate 20 is coupled to chip 30 by one or more solder bumps 40. It should be noted that although selected components of assembly 10 are illustrated in FIGS. 1A-1C at a high level, other materials and coupling techniques might be used. Moreover, assembly 10 may include any other well-known components and the techniques described herein may be applied to many varieties of semiconductor assemblies such as chip on chip, chip on substrate, electro-optic component on chip, and micro-electro-mechanical systems (MEMS) on chip, for example.

Base substrate 20 may comprise any suitable surface and may comprise any suitable ceramic or organic material. For example, base substrate 20 may comprise a plastic surface mount for chip 30 (also referred to as a package). As another example, base substrate 20 may comprise a second semiconductor chip that also acts as a base substrate for chip 30. In the illustrated embodiment, base substrate 20 includes a solder mask 22 that defines an opening for bump pads 24. Bump pads 24 connect to circuitry within base substrate 20 that allows base substrate 20 to electrically (or otherwise) couple chip 30 with an external device or with one or more other components coupled to base substrate 20. Solder mask 22 may comprise any suitable non-conductive material such as polymer, for example. Bump pads 24 may comprise any suitable conductive material such as copper, for example.

Chip 30 may comprise any suitable device operable to perform data transmission. For example, chip 30 may perform data transmission using electric signals. Chip 30 may refer to a silicon chip, microelectronic chip, optoelectronic chip, MEMS chip, microchip die, integrated circuit, or any other suitable data transmission device. Chip 30 may be coupled to base substrate 20 by any suitable technique, such as by flip-chip coupling, for example.

Chip 30 includes contact pads 32 that provide input/output (I/O) to chip 30. Contact pads 32 may comprise any suitable conductive material such as copper, for example. Chip 30 may also includes a passivation layer 34 that provides a contamination protection layer for chip 30. Passivation layer 34 may comprise any suitable layer of material such as dielectric material, for example. Chip 30 may further include under bump metallurgy (UBM) layers 36 that assist in coupling chip 30 to solder bumps 40. UBM layer 36 may comprise any suitable conductive material such as nickel, for example.

Solder bumps 40 may comprise any suitable material operable to interconnect chip 30 and substrate 20. According to one embodiment, solder bumps 40 may comprise a deformable material (e.g., a material in a molten state) that can be temporarily deformed into a stretched state so that the gap height of assembly 10 can be increased, as described in more detail below. According to various embodiments, solder bumps 40 may comprise any suitable conductive material such as gold, tin, lead, or copper, for example. According to other embodiments, solder bumps 40 may comprise other types of interconnections such as microelectronic interconnections, optical interconnections, or any other suitable interconnections. As described in more detail below, solder bumps 40 may suffer from stress reducing the reliability of solder bumps 40 and assembly 10.

FIG. 1B is a diagram illustrating an example of the results of stress to semiconductor assembly 10 of FIG. 1A. Assembly 10 may suffer from stress caused by relative movement between chip 30 and base substrate 20. As a result, solder bumps 40 may suffer from cracks, as shown in FIG. 1B. For example, chip 30 may contract and move with respect to base substrate 20, as indicated by reference number 44 in FIG. 1B, thereby causing stress to solder bumps 40, as indicated by reference number 42 in FIG. 1B.

FIG. 1C is a diagram illustrating an underfill material 50 applied to semiconductor assembly 10 of FIG. 1A. Underfill 50 may be applied between the chip and the base substrate 20 to reinforce the mechanical strength of solder bumps 40. Underfill 50 may comprise a flux material mixed with any suitable organic material, such as an epoxy, for example.

However, it may be difficult to introduce underfill 50 in the gap between chip 30 and base substrate 20 because the gap may be too small and the composition of underfill 50 may have a high viscosity. Moreover, even if it is possible to apply underfill 50, some small amounts of underfill 50 may flow between solder bumps 40 and base substrate 20, thereby causing significant reliability problems. Yet a small gap between chip 30 and base substrate 20 is highly desirable in order to achieve short wiring lengths and high interconnect densities in assembly 10.

Particular embodiments of the present invention provide deformable solder bumps 40 that deform into a stretched state (e.g., solder in a molten state) as the gap height of assembly 10 is increased due to pulling apart chip 30 and base substrate 20. Underfill 50 may then be applied to reinforce assembly 10. The gap height is then decreased and the deformable solder bumps are deformed into a compressed state to form a lower profile assembly 10. According to one embodiment, barricades disposed on the surface of the base substrate and/or the chip are operable to confine the deformed solder bumps 40 in the compressed state. Thus, the barricades prevent deformed solder bumps 40 from contacting each other and deformed solder bumps 40 prevent underfill 50 from flowing between solder bumps 40 and base substrate 20.

Figure 2A:
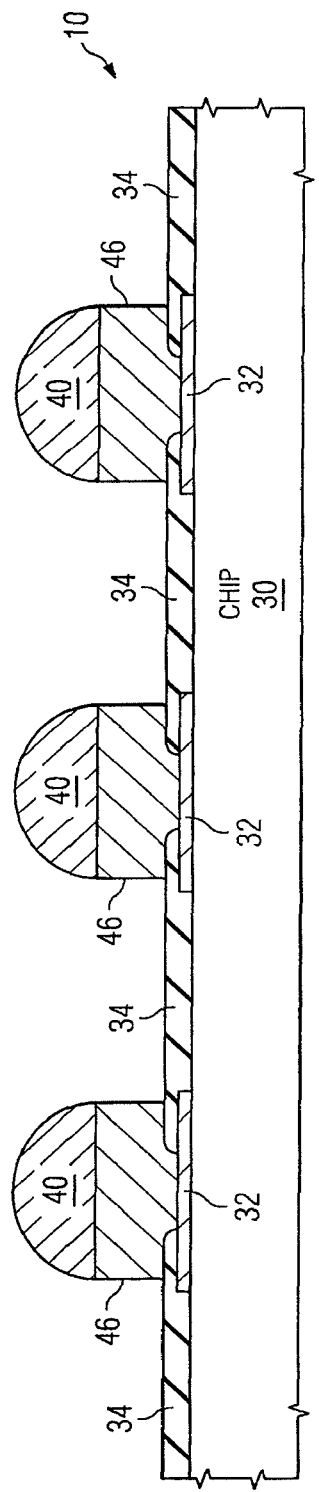
FIG. 2A is a diagram illustrating the chip of FIG. 1A with conductor bases disposed on the surface of the chip, in accordance with one embodiment of the present invention.

FIG. 2A is a diagram illustrating chip 30 of FIG. 1A with conductor bases 46 disposed on the surface of chip 30, in accordance with one embodiment of the present invention. As described in more detail below, conductor bases 46 may comprise any suitable material such as a copper stud, for example, to provide a conductive protrusion that serves as a support for deformable solder bumps 40. According to one embodiment of the present invention, conductor bases 46 are deposited on the surface of chip 30, at least partially covering passivation layer 34 and contact pads 32. Thus, according to the illustrated embodiment, conductor bases 46 replace UBM layers 36, and conductor bases 46 are operable to provide a conductive structure to couple chip 30 to solder bumps 40. However, it should be recognized that although conductor bases 46 are illustrated as replacing UBM layers 36, in other embodiments conductor bases 46 may not be used or may be disposed on top of UBM layers 36.

Figure 2B:
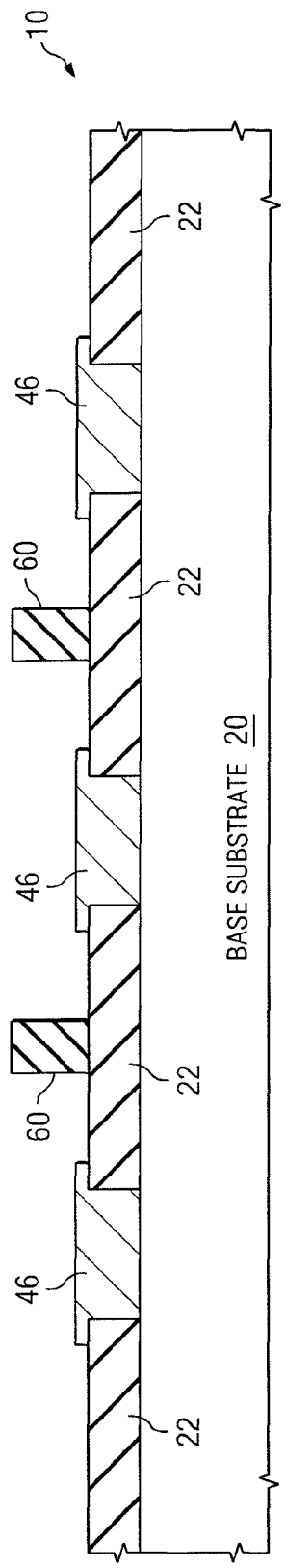
FIG. 2B is a diagram illustrating the base substrate of FIG. 1A with conductor bases and barricades disposed on the surface of the base substrate, in accordance with one embodiment of the present invention.

FIG. 2B is a diagram illustrating base substrate 20 of FIG. 1A with conductor bases 46 and barricades 60 disposed on the surface of base substrate 20, in accordance with one embodiment of the present invention. According to one embodiment of the present invention, conductor bases 46 are deposited on the surface of base substrate 20, at least partially filling in the openings in solder mask 22. Thus, according to the illustrated embodiment, conductor bases 46 replace bump pads 24, and conductor bases 46 are operable to connect to circuitry within base substrate 20 to allow base substrate 20 to electrically couple chip 30 with an external device or with other components coupled to base substrate 20. However, it should be recognized that although conductor bases 46 are illustrated as replacing bump pads 24, in other embodiments conductor bases 46 may not be used or may be disposed on top of bump pads 24.

Moreover, several other aspects of different embodiments are apparent from FIG. 2B. For example, although conductor bases 46 are illustrated as extending above solder mask 22 in FIG. 2B, conductor bases 46 may have any suitable height. As another example, conductor bases 46 may be disposed on one side of assembly 10 (such as on base substrate 20) instead of on both base substrate 20 and chip 30. Indeed, the present disclosure contemplates many different arrangements of conductor bases 46. Various embodiments may include, some, all, or none of the enumerated arrangements.

In the illustrated embodiment, base substrate 20 also includes barricades 60 disposed substantially perpendicular to base substrate 20. According one embodiment, barricades 60 need not be disposed perpendicular to base substrate 20 and may be disposed in any suitable manner. According to another embodiment, barricades 60 may be disposed on chip 30.

According to one embodiment of the present invention, as the gap height between chip 30 and base substrate 30 is decreased, solder bumps 40 deform into a compressed state and bulge laterally. As described in more detail below, barricades 60 are operable to confine the deformed solder bumps 40 in the compressed state.

Barricades 60 may comprise any suitable non-conductive material such as a polymer, photo-epoxy, or polysiloxane based material, for example. Moreover, although the illustrated embodiments show barricades 60 with a rectangular shape, barricades 60 may have any suitable shape, such as a rounded, square, triangular, or multi-angular shape. Indeed, the present disclosure contemplates many different shapes and compositions of barricades 60. Various embodiments may include, some, all, or none of the enumerated shapes and compositions.

According to one embodiment of the invention, barricades 60 may be formed by photolithography. For example, a resist material may be deposited on top of solder mask 22 such that solder mask 22 is completely covered. The resist material is then etched to leave protrusions formed on the surface base substrate 20.

According to another embodiment, barricades 60 may be disposed on a surface of base substrate 20 by bonding each barricade 60 to the surface with an epoxy, solder, or any other similar material. According to yet another embodiment, two or more barricades 60 may be positioned in contact with each other to reinforce each other and improve the structural integrity of barricades 60. Indeed, the present disclosure contemplates many types of techniques for disposing barricades 60 on base substrate 20. Various embodiments may include, some, all, or none of the enumerated techniques. A better understanding of particular embodiments of the present invention is provided below with reference to FIGS. 3A-3D, each FIG. 3A-3D illustrating an exemplary stage of the assembly process.

Figure 3A:
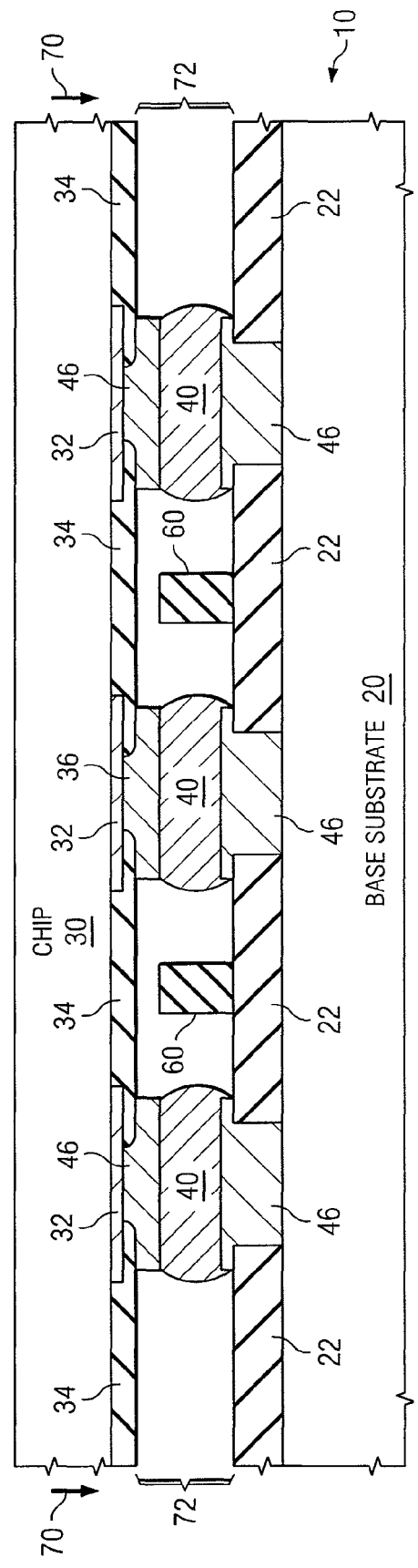
FIG. 3A is a diagram illustrating the chip of FIG. 2A coupled with the base substrate of FIG. 2B, in accordance with one embodiment of the present invention.

FIG. 3A is a diagram illustrating chip 30 of FIG. 2A coupled with base substrate 20 of FIG. 2B, in accordance with one embodiment of the present invention. In the illustrated embodiment, solder bumps 40 applied to chip 30 are positioned over base substrate 20, such that each solder bump 40 is aligned with a corresponding conductor base 46 or similar surface on the surface of base substrate 20, and chip 30 is spaced apart from base substrate 20 by a gap, as indicated by reference number 72. With deformable solder bumps 40 disposed between, and in contact with the chip 30 and bump pads 24, a gap 72 is formed between a surface of chip 30 and a facing surface of base substrate 20.

Figure 3B:
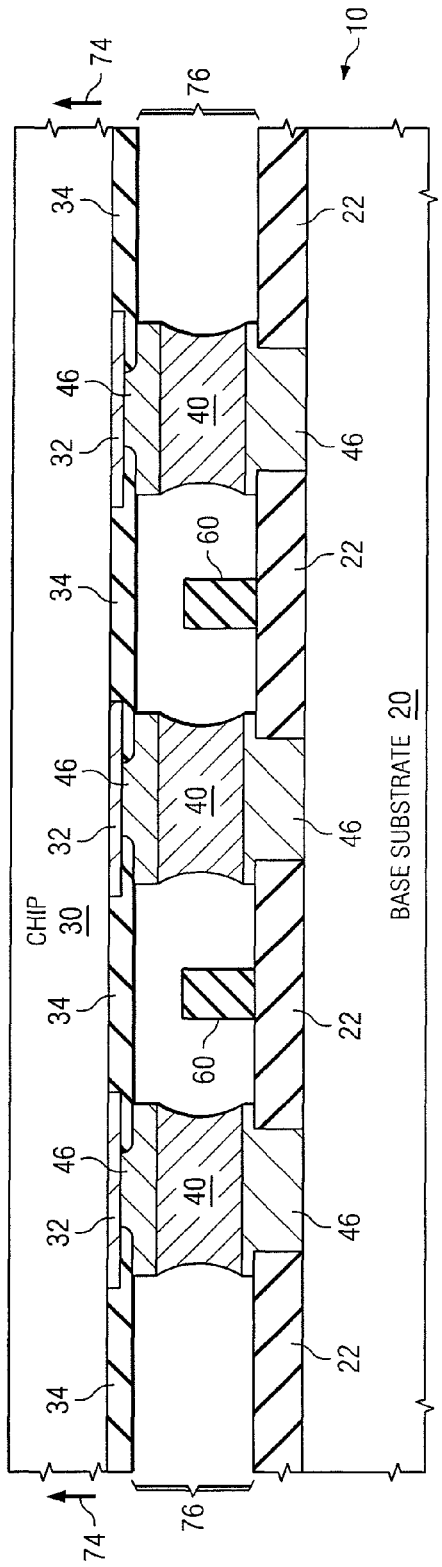
FIG. 3B is a diagram illustrating the assembly of FIG. 3A with an increased gap height, in accordance with one embodiment of the present invention.

FIG. 3B is a diagram illustrating assembly 10 of FIG. 3A with an increased gap height, in accordance with one embodiment of the present invention. In the illustrated embodiment, a gap height 76 between chip 30 and base substrate 20 is increased, as indicated by reference number 74, and deformable solder bumps 40 are accordingly stretched. This increase in the gap height between chip 30 and base substrate 20 facilitates the application of underfill 50 as described below with reference to FIG. 3C.

Figure 3C:
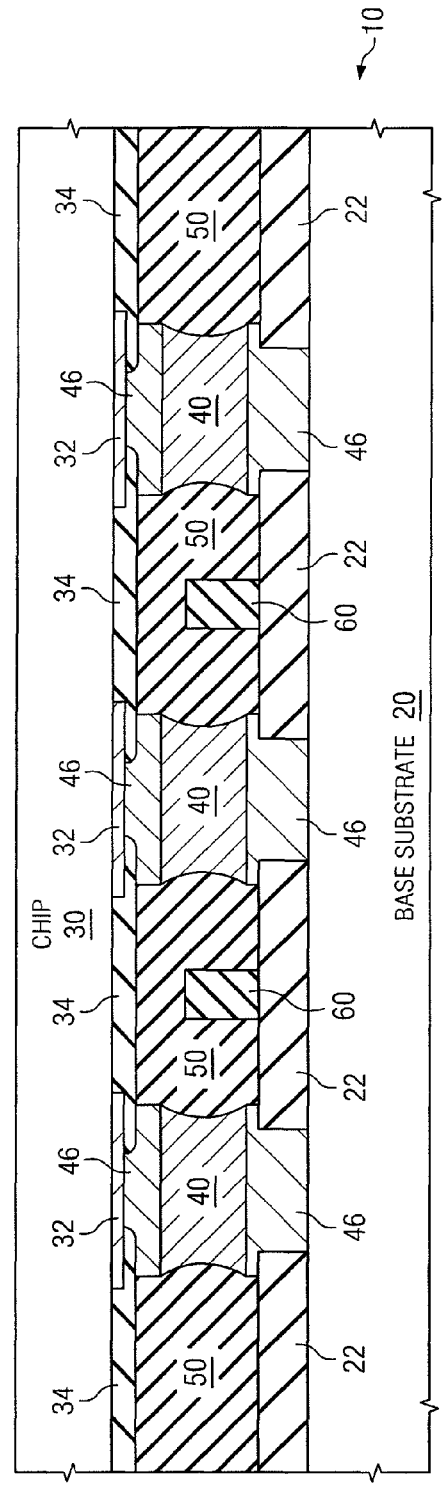
FIG. 3C is a diagram illustrating an underfill material applied to the assembly of FIG. 3B, in accordance with one embodiment of the present invention.

FIG. 3C is a diagram illustrating underfill 50 applied to assembly 10 of FIG. 3B, in accordance with one embodiment of the present invention. As described above, a CTE mismatch may cause differences in expansion and contraction between base substrate 20 and chip 30, which weakens solder bumps 40 and induces stress. Underfill 50 may be applied to reinforce the mechanical strength of assembly 10, and then the gap height between base substrate 20 and chip 30 is decreased to form a lower profile assembly 10, as described below with reference to FIG. 3D.

FIG. 3D is a diagram illustrating assembly 10 of FIG. 3C with a decreased gap height, in accordance with one embodiment of the present invention. As shown in the illustrated embodiment, after underfill 50 is applied, and a gap height 94 between chip 30 and base substrate 20 is decreased, as indicated by reference number 90, solder bumps 40 deform into a compressed state and bulge laterally, as indicated by reference number 92. Thus, deformed solder bumps 40 prevent underfill 50 from flowing between solder bumps 40 and base substrate 20, and barricades 60 confine deformed solder bumps 40 in the compressed state to prevent deformed solder bumps 40 from contacting each other.

Thus, example embodiments of the present invention provide a low-profile assembly. The gap height between the chip and base substrate is increased. Underfill may then be applied to reinforce the assembly. The gap height between the chip and base substrate is then decreased to form a lower profile assembly. Barricades disposed on the surface of the base substrate and/or chip 30 are operable to confine deformed solder bumps from bulging laterally. This prevents shorts between the solder bumps, and results in reliable, low profile, and high density solder bumps. Further, deformed solder bumps prevent underfill from flowing between the solder bumps and the base substrate.

FIG. 4 is a flow diagram illustrating an example method 100 for providing a semiconductor assembly, in accordance with one embodiment of the present invention. The example method begins at step 102 where a base substrate is provided that has a first surface. For example, the base substrate may comprise a plastic surface mount for a chip (also referred to as a package). As another example, the base substrate may comprise a second semiconductor chip.

At step 104, a chip is coupled to the base substrate. According to one embodiment, the chip has a second surface facing the first surface of the base substrate. In the embodiment, the chip is spaced apart from the base substrate forming a gap, and at least a portion of the base substrate is coupled to the chip by solder bumps. According to one embodiment, the solder bumps comprise a deformable material, such that as a height of the gap between the chip and the base substrate increases, the solder bumps deform into a stretched state.

At step 106, barricades comprising a plurality of nonconductive protrusions are disposed between the chip and the base substrate. According to one embodiment, the barricades are disposed on the first surface of the base substrate. According to another embodiment, the barricades are disposed on the second surface of the chip. In these embodiments, the plurality of barricades are operable to confine the solder bumps in a compressed state.

At step 108, an underfill material is applied between the base substrate and the chip. According to one embodiment, the underfill material is operable to substantially fill the gap between the chip and the substrate and surround the plurality of solder bumps in the stretched state.

It should be understood that some of the steps illustrated in FIG. 4 may be combined, modified or deleted where appropriate, and additional steps may also be added to the flow diagram. Additionally, as indicated above, steps may be performed in any suitable order without departing from the scope of the invention.

Although the present invention has been described in detail with reference to particular embodiments, it should be understood that various other changes, substitutions, and alterations may be made hereto without departing from the spirit and scope of the present invention. For example, although the present invention has been described with reference to a number of components included within assembly 10, other and different components may be utilized to accommodate particular needs. The present invention contemplates great flexibility in the arrangement of these elements as well as their internal components.

Numerous other changes, substitutions, variations, alterations and modifications may be ascertained by those skilled in the art and it is intended that the present invention encompass all such changes, substitutions, variations, alterations and modifications as falling within the spirit and scope of the appended claims. Moreover, the present invention is not intended to be limited in any way by any statement in the specification that is not otherwise reflected in the claims.

What is claimed is:

1. A method for providing a semiconductor assembly, comprising:
    providing a substrate having a first surface;
    disposing a plurality of barricades on the first surface of the substrate, the barricades comprising a plurality of nonconductive protrusions extending from the first surface of the substrate;
    coupling a chip to the substrate, the chip having a second surface facing the first surface of the substrate, the chip spaced apart from the substrate forming a gap, wherein at least a portion of the substrate is coupled to the chip by a plurality of solder bumps;
    the plurality of solder bumps comprising a deformable material, such that as a height of the gap between the chip and the substrate increases, the plurality of solder bumps are operable to deform into a stretched state;
    increasing the height of the gap between the chip and the substrate such that the plurality of solder bumps enter the stretched state;
    applying an underfill material between the substrate and the chip, the underfill material operable to substantially fill the gap between the chip and the substrate and surround the plurality of solder bumps in the stretched state; and
    decreasing the height of the gap between the chip and the substrate such that the plurality of solder bumps enter a compressed state, the plurality of barricades being configured to confine the plurality of solder bumps in the compressed state.

2. The method of claim 1, wherein the plurality of barricades are substantially perpendicular to the substrate.

3. The method of claim 1, wherein each of the plurality of barricades has a rectangular shape.

4. The method of claim 1, wherein the plurality of barricades are formed using photolithography.

5. The method of claim 1, wherein each of the plurality of barricades comprises a polymer.

6. The method of claim 1, wherein the plurality of barricades further comprise one or more barricades extending from the second surface of the chip, where disposing the plurality of barricades comprises positioning at least one barricade extending from the first surface of the substrate in contact with at least one barricade extending from the second surface of the chip.

7. The method of claim 1, wherein the underfill material comprises an epoxy.

8. The method of claim 1, wherein:
    the substrate has a first coefficient of thermal expansion;
    the chip has a second coefficient of thermal expansion; and
    the first coefficient of thermal expansion is different from the second coefficient of thermal expansion.

9. The method of claim 1, wherein each of the plurality of solder bumps comprises copper.

10. The method of claim 1, wherein the substrate comprises a second chip.

* * * * *